United States Patent
Aoyama

(10) Patent No.: US 8,043,719 B2
(45) Date of Patent: Oct. 25, 2011

(54) METAL MEMBER HAVING PRECIOUS METAL PLATING

(75) Inventor: Naotaka Aoyama, Toyoake (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 137 days.

(21) Appl. No.: 12/302,807

(22) PCT Filed: May 25, 2007

(86) PCT No.: PCT/IB2007/001375
§ 371 (c)(1),
(2), (4) Date: Nov. 28, 2008

(87) PCT Pub. No.: WO2007/138436
PCT Pub. Date: Dec. 6, 2007

(65) Prior Publication Data
US 2009/0269612 A1    Oct. 29, 2009

(30) Foreign Application Priority Data
May 29, 2006  (JP) .................................. 2006-148109

(51) Int. Cl.
*B32B 15/04*  (2006.01)
*B32B 15/08*  (2006.01)

(52) U.S. Cl. ........ 428/670; 428/336; 428/220; 428/672; 428/673; 428/685; 428/660

(58) Field of Classification Search .................. 428/332, 428/336, 220, 670, 669, 672, 673, 681, 684, 428/685, 687, 660, 634, 627
See application file for complete search history.

(56) References Cited

U.S. PATENT DOCUMENTS

| 6,866,958 B2 * | 3/2005 | Vyas et al. ..................... 429/492 |
| 6,893,765 B1 | 5/2005 | Nishida et al. |
| 2002/0004158 A1 | 1/2002 | Suzuki et al. |
| 2006/0003174 A1 * | 1/2006 | Yashiki et al. ................. 428/472 |

FOREIGN PATENT DOCUMENTS

| CA | 2 486 687 | 5/2005 |
| EP | 1 235 288 | 8/2002 |
| GB | 1 474 358 | 5/1977 |
| JP | 2000 164228 | 6/2000 |
| JP | 2000 323151 | 11/2000 |
| JP | 2001 6713 | 1/2001 |
| JP | 2007-063625 | * 3/2007 |

OTHER PUBLICATIONS

Nagano et al., JP 2007-063625, Mar. 2007.*

* cited by examiner

*Primary Examiner* — Michael Lavilla
(74) *Attorney, Agent, or Firm* — Oblon, Spivak, McClelland, Maier & Neustadt, L.L.P.

(57) ABSTRACT

A metal member is manufactured that has a plating layer of precious metal on the surface of a bare metal portion formed of a predetermined metal. First, a surface layer of the bare metal portion is removed. Then, a plating of precious metal is applied to the portion where the surface layer of the bare metal portion was removed. Then, the metal member is heat treated in an inert atmosphere. As a result, a metal member can be manufactured that has less carbide and hydrogen near a boundary surface of the plating layer and the bare metal portion than it would if the removing step and the heat treating step were not performed. With a metal member manufactured in this way, the plating layer does not easily peel away.

6 Claims, 3 Drawing Sheets

METAL MEMBER HAVING PRECIOUS METAL PLATING

BACKGROUND OF THE INVENTION

1. Field of the Invention

The invention relates to a metal member having precious metal plating and a manufacturing method thereof. More specifically, the invention relates to a metal member having a precious metal plating which does not peel away easily and a manufacturing method thereof.

2. Description of the Related Art

When forming a separator of a fuel cell using material in which the contact resistance between the fuel cell and the electrode increases when used as it is, precious metal plating is applied to the portion of the separator surface that contacts the electrode. For example, in Japanese Patent Application Publication No. JP-A-2001-6713, stainless steel with a precious metal adhered to its surface is produced by performing a process in which minute amounts of platinum are deposited on the surface of stainless steel while mechanically removing a passive film (oxide film) by lightly polishing the stainless steel with silicon carbide paper.

Further, in Japanese Patent Application Publication No. JP-A-2000-164228, a fuel cell separator includes a coating layer which has a multiple layered structure formed of two layers or more of a low electrical resistant layer, a corrosion resistant layer and peeling resistant layer. Japanese Patent Application Publication No. JP-A-2000-323151 describes a fuel cell including a separator in which a conductive contact point having corrosion resistance is arranged at a part of conductive gas passage plate abutting on a gas diffusion electrode. Japanese Patent Application Publication No. JP-A-2002-134136 provides a surface treatment method in which a coating particles are vibrated and made to flow by supersonic beam; and while the surface oxide film of the passive state metal is removed by the collision of the coating particles against the surface under treatment, the coating particles are attached to part or whole of the oxide film removed part.

However, even if the precious metal plating layer is firmly bonded to the other metal of the member immediately after the precious metal layer is formed, as time passes a metal compound layer forms at the boundary surface of the plating layer and the other metal, and as a result, the precious metal plating layer may peels away. This kind of problem is not only limited to separators of fuel cells, but can occur whenever a metal member in which an oxide film tends to form on the surface has been plated with precious metal.

SUMMARY OF THE INVENTION

This invention thus provides a metal member having a precious metal plating layer that does not peel away easily, as well as technology to produce that metal member.

Thus, one aspect of the invention relates to a metal member having a precious metal plating layer on a surface of bare metal portion formed of a predetermined metal, in which the atomic percent of hydrogen atoms near a boundary surface of the bare metal portion and the plating layer is no more than 1.0%. This reduces the likelihood of the plating layer peeling away easily due to metal hydride forming near the boundary surface of the plating layer and the bare metal portion. Incidentally, this metal member may be used as a separator of a fuel cell.

The atomic percent of carbon atoms near the boundary surface is may also be made to be no more than 30%. This reduces the likelihood that the plating layer is easily peeled away due to metal oxide formed by oxidizing the carbide that is present near the boundary surface of the plating layer and the bare metal portion. This structure is particularly preferable because the fuel cell separator may be placed in an environment where oxidation readily occurs from acid fluid.

The average value of the atomic percent of carbon atoms near the boundary surface may also be approximately 5%. Regarding the average value of the atomic percent of atoms of a given element, approximately X % means a range of plus or minus 10% of X %. For example, approximately 5% means 4.5% to 5.5%.

The predetermined metal of which the bare metal portion is formed may be titanium or stainless steel.

The metal member having a plating layer of precious metal on the surface of a bare metal portion formed of a predetermined metal may also be manufactured according to the following method. First, a surface layer of the bare metal portion is removed (removing step). Then, a plating of precious metal is applied to the portion where the surface layer of the bare metal portion was removed (removing step). Then, the metal member is heat treated in an inert atmosphere (heat treating step). As a result, a metal member can be manufactured that has less carbide and hydrogen near the boundary surface of the plating layer and the bare metal portion than it would if the removing step and the heat treating step were not performed. With a metal member manufactured in this way, the plating layer does not easily peel away. The heat treatment may be such that the hydrogen disperses so that the atomic percent of hydrogen atoms near the boundary surface of the bare metal portion and the plating layer is no more than 1.0%.

In the heat treating step, the metal member may be heat treated in an atmosphere of between 220° C. and 600° C., inclusive. As a result, a metal member can be manufactured that has less hydrogen near the boundary surface of the plating layer and the bare metal portion than it would if it were heat treated at another temperature.

In the removing step, a portion that includes the surface of the bare metal portion and which has a higher carbon content than a surface portion of the bare metal portion after the surface layer has been removed may be removed as the surface layer. As a result, a metal member can be manufactured that has less carbide near the boundary surface of the plating layer and the bare metal portion than it would if the removing step was not performed.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE PREFERRED EMBODIMENTS

Next, the invention will be described in the following order: A. Example embodiments, B. Test examples, C. Modified examples

A. Example Embodiments

Figure 1:
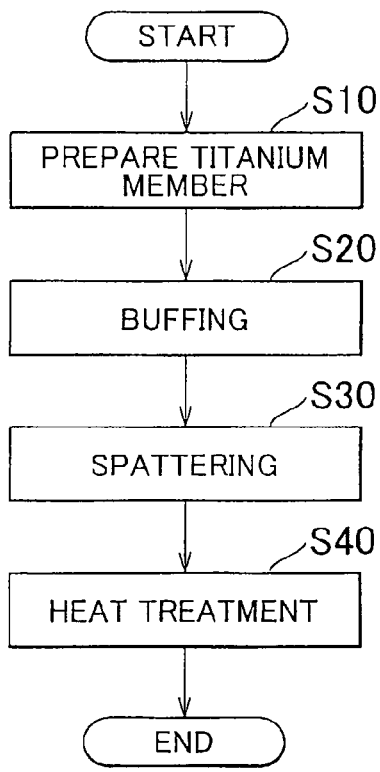
FIG. 1 is a flowchart illustrating a manufacturing method of a separator according to an example embodiment of the invention.

FIG. 1 is a flowchart illustrating a manufacturing method of a separator according to an example embodiment of the invention. In step S10, a titanium separator member is first prepared. This separator member can be a plate-like member formed of JIS 1 type pure titanium, for example. Incidentally, a carbide layer which includes TiC formed from a reaction between the titanium and a carbon inclusion of a rolling solution or the like that was applied at the time of press forming, on the surface of the titanium separator member.

Figure 2:
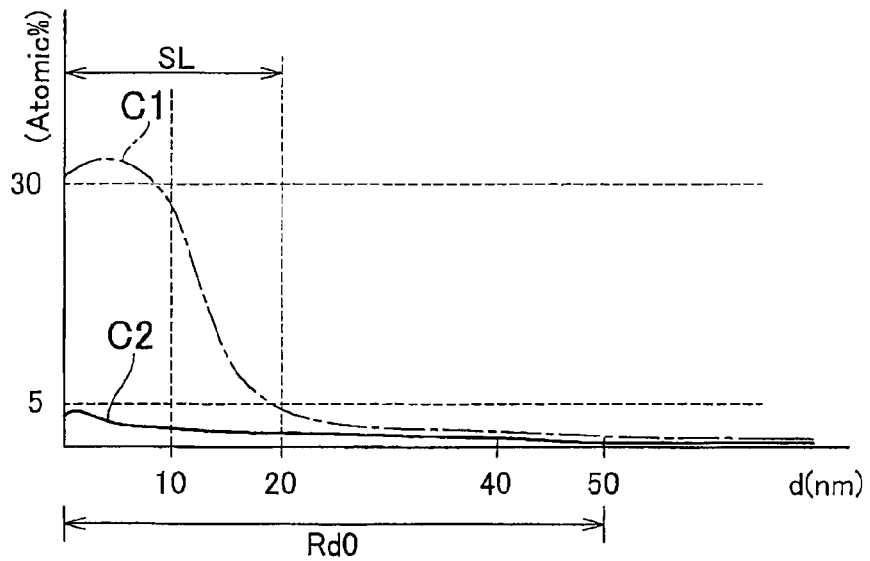
FIG. 2 is a graph showing the distribution of the atomic percent of carbon atoms in the depth direction of a separator member.

FIG. 2 is a graph showing the distribution of the atomic percent of carbon atoms in the depth direction of the separator member. The horizontal axis of the graph represents the position d in the depth direction of the separator member, and the vertical axis of the graph represents the atomic percent of carbon atoms (atomic %). The numerical values in the graph in FIG. 2 are values obtained by X-ray Photoelectron Spectroscopy or XPS. In this specification the carbon content will be evaluated by the atomic percent of carbon atoms measured according to this method.

In FIG. 2, C1 indicates the distribution of the atomic percent of carbon atoms in the depth direction of the titanium separator member that was prepared in step S10. As is evident from FIG. 2, with the titanium separator member that was prepared in step S10, the maximum value of the atomic percent of carbon atoms in the range Rd0 from the surface (depth of 0) to 50 nm deep exceeds 30% and the average value is no more than 5%.

In step S20, the carbide on the surface layer SL is removed by buffing the surface of the separator member. Incidentally, the surface layer of a member refers to a portion of the member which includes the surface of the member. In this case, the surface of the separator member is buffed until a layer of material approximately 20 nm thick has been removed.

The thickness of the surface layer removed in step S20 can be determined according to the distribution of the atomic percent of carbon atoms in the separator member that was prepared in step S10. In this case, in a separator member in which the distribution of the atomic percent of carbon atoms is as shown by C1 in FIG. 2, a surface layer SL approximately 20 nm thick is removed so that the atomic percent of carbon atoms up to 50 nm deep from the surface of the titanium metal portion after the surface layer has been removed is no more than 5%.

In FIG. 2, C2 indicates the distribution of the atomic percent of carbon atoms in the depth direction of the separator member after step S20 has been performed. As is evident from FIG. 2, after step S20 the atomic percent of carbon atoms is below the average value of 5% in the range from the surface (depth of 0) to 50 nm deep in the titanium separator member. Incidentally, at C2 in FIG. 2, the percentage of carbon is not the highest at the surface (depth of 0). Rather, the percentage of carbon is the highest near a depth of 2 to 3 nm. This is thought to be because the amount of carbon is less near the surface of the separator member than it is inside the member where there is 100% metal because of surface asperities.

Then in step S30 in FIG. 1, the surface of the separator member is gold plated by spattering. More specifically, in a $10^{-2}$ Torr argon atmosphere, spattering is performed with gold so that the plating layer becomes approximately 10 nm thick. At this time, $H^+$ from the small amount of $H_2O$ in the environment is introduced onto the gold plating layer.

In step S40 in FIG. 1, the gold plated separator member is heat treated for approximately 30 minutes at a target temperature of 400° C. with the actual heating temperature being 220° C. to 450° C. in a $10^{-2}$ Torr argon atmosphere. Performing this kind of heat treatment removes hydrogen that is present near the boundary surface of the gold plating layer and the titanium layer as hydrogen gas outside the sample or diffuses it in the titanium metal layer.

Figure 3:
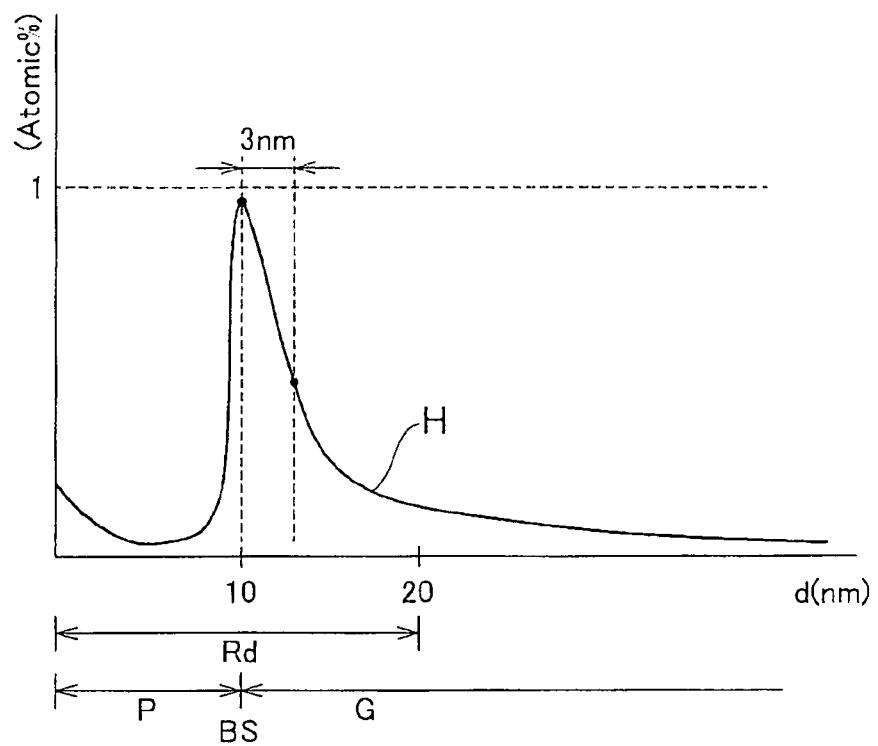
FIG. 3 is a graph showing the distribution of the atomic percent of carbon atoms in the depth direction of the separator member after heat treatment.

FIG. 3 is a graph showing the distribution of the atomic percent of hydrogen atoms in the depth direction of the separator member after heat treatment has been performed. The horizontal axis of the graph represents the position d in the depth direction of the separator member, and the vertical axis represents the atomic percent of hydrogen atoms (atomic %). The numerical values in the graph in FIG. 3 are values obtained by measurements according to Rutherford Backscattering Spectroscopy or RBS. In this specification the hydrogen content will be evaluated by the atomic percent of hydrogen atoms measured according to this method. Incidentally, with Rutherford Backscattering Spectroscopy there is error of several nm in the depth direction.

As is evident from the graph in FIG. 3, the atomic percent of hydrogen atoms is highest near the boundary surface of the titanium layer G and the gold plating layer P about 10 nm deep. However, as a result of the heat treatment in step S40, the atomic percent of hydrogen atoms is at most no more than 1% in the range Rd of plus or minus 10 nm of the boundary surface of the gold plating layer P and the titanium layer G. Incidentally, in the graph in FIG. 3, the atomic percent of hydrogen atoms is approximately half at a depth of 3 nm on the titanium layer G side from the peak. Also, the reason for the percentage of hydrogen being higher near the surface (depth of 0) which is at the left end in the graph than at a depth of several nm is thought to be because OH based hydrogen that was adhered to the gold plated surface is detected.

Figure 4:
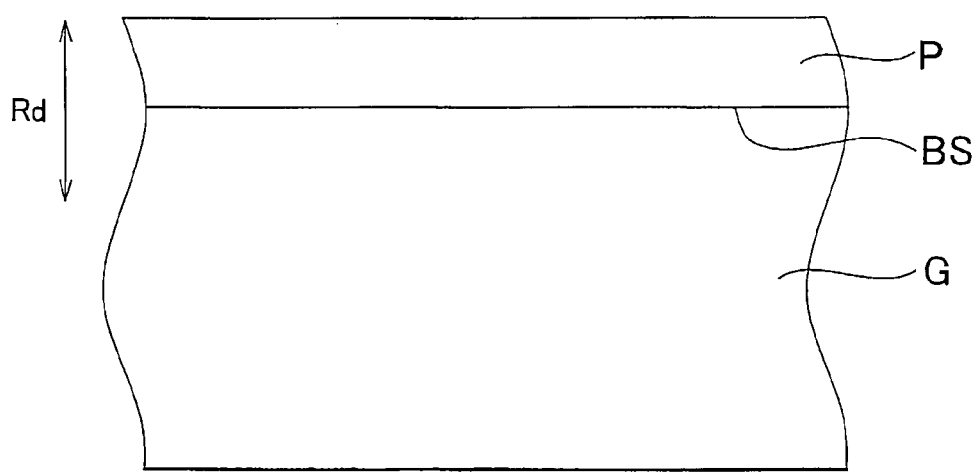
FIG. 4 is a view of the separator member produced according to the method shown in FIG. 1.

FIG. 4 is a view of the separator member produced by the method shown in FIG. 1. In the manner described above, it is possible to manufacture a titanium separator member in which the atomic percent of hydrogen atoms is no more than 1% in the range Rd near the boundary surface BS of the gold plating layer P and the titanium layer G as the bare metal portion. Incidentally, in this specification, the phrase "near the boundary surface" when describing the atomic percent of atoms of an element refers to a range between the position 10 nm above the boundary surface BS and the position 10 nm below the boundary surface BS, and is a range that includes the plating layer P or the bare metal portion G.

Also, in the process in step S30, in which the gold plating layer is applied to the titanium metal surface, as well as the process thereafter, the atomic percent of carbon atoms in the titanium metal does not increase. Therefore, with the titanium separator member obtained by the method in FIG. 1, the atomic percent of carbon atoms is on average no more than 5% at a depth of 50 nm near the boundary surface BS (which corresponds to the titanium metal surface after step S20 and before step S30) of the gold plating layer P and the titanium layer G (see C2 in FIG. 2).

B. Test Example

B1. Test Example 1

A plurality of separator members were produced under a variety of different buffing conditions in step S20 in FIG. 1 so that the average value of the atomic percent of carbon atoms in the range from the uppermost surface of the separator member after buffing to a depth of 50 nm (hereinafter this range will be referred to as the "surface portion") for each of the separator members is different and within a range from 1% to 14%. Incidentally, in the procedure for producing the separator members, the processes of steps 20 and thereafter are the same. The plurality of separator members produced under different conditions in this way were then immersed in a 80° C. sulfuric acid solution with a pH value of 2 for 24 hours, after which they were subjected to a peel test. The test was performed according to the tape peel test prescribed by JIS.

Figure 5:
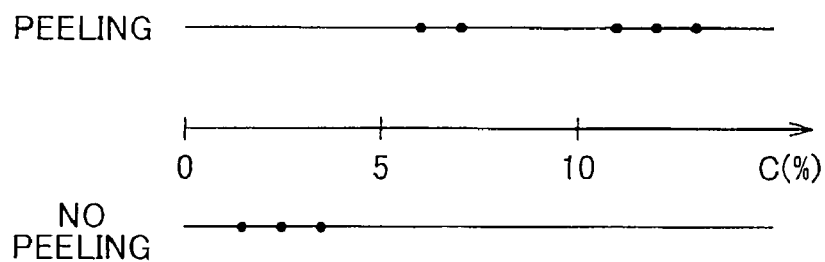
FIG. 5 is a view showing the results of a peel test for a separator produced when the conditions of the buffing in step S20 were changed.

FIG. 5 is a view showing the results of the peel test for a separator produced when the conditions of the buffing in step S20 were changed. In FIG. 5, the black dots show the test results of the separator members produced under different conditions. The horizontal axis in the middle indicates the atomic percent of carbon atoms. The points shown on the line above the horizontal axis indicate the separator members in which peeling occurred while the dots on the line below the horizontal axis indicate the separator members in which peeling did not occur. As is evident from FIG. 5, when the JIS 1 type titanium that was employed in the example embodiment described above is used as the metal of the bare metal portion G and gold plating is applied, the gold plating layer P tends to peel away when the average value of the atomic percent of carbon atoms exceeds 5%. When the carbon content is less than 5%, the gold plating layer P does not peel away easily.

B2. Test Example 2

A plurality of separator members were produced under a variety of different heat treatment conditions in step S40 in FIG. 1 so that the maximum value of the atomic percent of hydrogen atoms near the boundary surface of the bare metal portion and the plating layer after heat treatment for each of the separator members is different and within a range from 0.3% to 2.3%. Incidentally, in the procedure for producing the separator members, the processes of the steps other than step 40 are the same. The plurality of separator members produced under different conditions in this way were then immersed in a 80° C. sulfuric acid solution with a pH value of 2 for 24 hours, after which they were subjected to the peel test. The test was performed according to the tape peel test prescribed by JIS.

Figure 6:
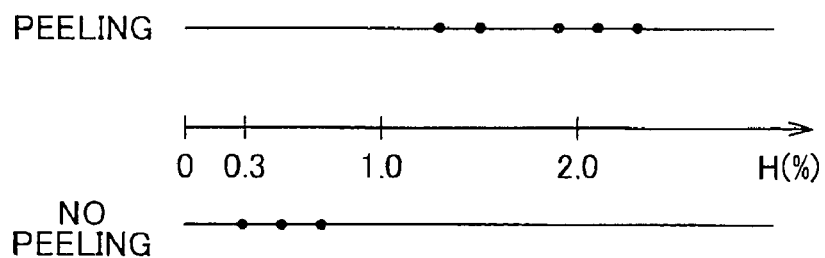
FIG. 6 is a view showing the results of a peel test for a separator produced when conditions of the heat treatment in step S40 were changed.

FIG. 6 is a view showing the results of the peel test for a separator produced when the conditions of the heat treatment in step S40 were changed. In FIG. 6, the horizontal axis in the middle indicates the atomic percent of hydrogen atoms. The other notation in FIG. 6 is the same as in FIG. 5. As is evident from FIG. 6, when the JIS 1 type titanium that was employed in the example embodiment described above is used as the metal of the bare metal portion G and gold plating is applied, the gold plating layer P tends to peel away when the maximum value of the atomic percent of hydrogen atoms exceeds 1%. When the hydrogen content is less than 1%, the gold plating layer P does not peel away easily.

B3. Test Example 3

Figure 7:
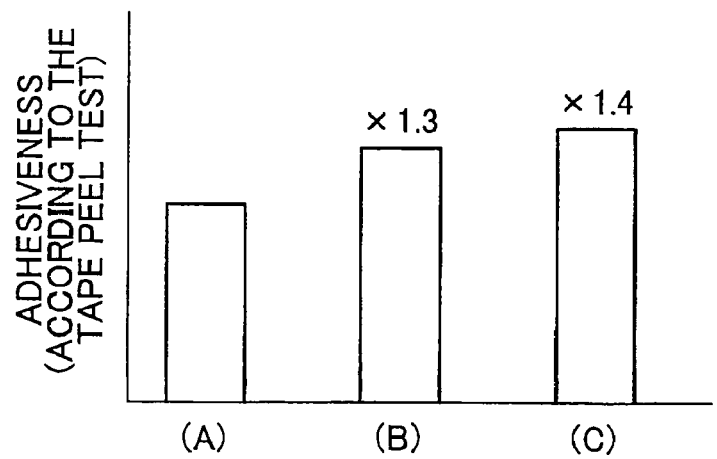
FIG. 7 is a graph showing the adhesiveness in the cases of a separator member (C) produced according to the method shown in the flowchart in FIG. 1, a separator member (A) produced without buffing or heat treatment, and a separator member (B) produced without heat treatment.

FIG. 7 is a graph showing the adhesiveness in the cases of a separator member (C) produced according to the method shown in the flowchart in FIG. 1, a separator member (A) produced without buffing in step S20 or heat treatment in step S40, and a separator member (B) produced without heat treatment in step S40. Incidentally, the adhesiveness is a value obtained from the peel test that is proportional to the reciprocal of the ratio of the area of the portion where peeling occurred to the overall area to which tape was applied.

As is evident from FIG. 7, the separator member (B) that was buffed but not heat treated has approximately 1.3 times the adhesiveness of the separator member (A) that was neither buffed (in step S20 in FIG. 1) nor heat treated (in step S40 in FIG. 1). Also, the separator member (C) that was both buffed and heat treated has 1.4 times the adhesiveness of the separator member (A) that was neither buffed nor heat treated.

B4. Analysis

The reason why the precious metal plating tends to peel away from the metal member is thought to be as follows. That is, the carbide present near the surface of the metal member before the plating was applied gradually reacts with oxygen at the boundary surface of the plating layer after the plating is applied. Then the carbide changes to oxide. When the carbide (such as TiC) on the metal member side at the boundary surface of the plating layer changes to oxide (such as $TiO_2$), the spacing of the crystal lattice changes. Accordingly, the plating layer ends up being out of alignment with the oxide layer which reduces the adhesiveness between the oxide layer and the plating layer. It is thought that as a result the precious metal plating tends to peel away from the metal member.

The carbide in the surface of the metal member before plating is applied is present at a depth ranging from several tens of nm to several hundred nm in the metal surface. In the foregoing example embodiment, the likelihood of the plating layer peeling away after the precious metal plating is applied is reduced by first removing this carbide layer from the precious metal plating (see step S20 in FIG. 1, and FIG. 2). When the bare metal portion is titanium, for example, the Ti that is exposed on the surface of the bare metal portion after the carbide has been removed resists oxidation more than the TiC which is carbide does.

Incidentally, the oxide reaction described above may occur by, for example, acidic liquid passing through a crack in the plating layer and reaching the boundary surface of the plating layer and the metal member. When the plating layer is applied by spattering, the plating material accumulates in columns in the direction of thickness, making it more vulnerable to cracking than plating applied by a wet process. Therefore, plating applied by a wet process is more suitable than that by spattering in some applications.

On the other hand, another reason why the precious metal plating tends to peel away from the metal member is thought to be as follows. That is, when applying precious metal plating under a high vacuum in an argon environment, hydrogen ions in small amounts of $H_2O$ that is present are introduced into the plating layer. Then these hydrogen ions gather at the boundary surface of the metal member and the precious metal plating layer by dispersion and form a hydride (for example, titanium hydride TiH or $TiH_2$ when the bare metal portion is titanium). Gold hydride is extremely brittle so the hydride layer portion is susceptible to breaking. It is thought that the plating layer ends up peeling away because this hydride layer breaks. In the foregoing example embodiment, the heat treatment after the plating has been applied disperses the hydrogen present in the boundary surface BS of the plating layer P and the bare metal portion G throughout the entire metal member. This is why it is thought that the plating layer of the member of the foregoing embodiment is less likely to peel away.

C. Modified Examples

The invention is not limited to only the example embodiments and examples described above. On the contrary, the invention can be modified without departing from the scope thereof. For example, the invention may also be realized in the form of a separator of a fuel cell, a manufacturing method of a separator of a fuel cell, a fuel cell that includes a titanium separator, and a manufacturing method of that fuel cell, and the like. Also, the following mode, for example, is also possible.

C1. Modified Example 1

In the foregoing example embodiment, the separator is formed of JIS 1 type titanium. However, the material of the plated metal member is not limited to this. That is, the material of the member that is plated with precious metal may also be JIS 2 or JIS 3 type titanium. Also, other than pure titanium as prescribed by JIS, a titanium alloy that includes large amounts of other metals may also be used. In addition, the material of the member that is plated with a precious metal may also be stainless steel. This allows the member to be manufactured at a lower cost than a titanium member.

That is, the foregoing example embodiment is also effective when the bare metal portion of the precious metal plated metal member is formed of metal that forms a passive film on the surface in a normal temperature atmosphere that includes oxygen. This kind of metal member will not corrode over an extended period of time and is thus able to perform stably as part of a fuel cell, for example.

Incidentally, in a mode in which precious metal plating is applied to a metal member made of stainless steel, the heat treatment corresponding to step S40 in FIG. 1 can also be omitted because hydride does not form as easily on stainless steel as it does on titanium.

C2. Modified Example 2

In the foregoing example embodiment, the plating layer formed on the metal member is a layer of gold. Alternatively, however, the plating layer formed on the metal member may also be of another material such as platinum or copper, for example. However, the plating layer preferably has greater conductivity than the oxide of the material of the metal member, and even more preferably is of a precious metal.

C3. Modified Example 3

In the foregoing example embodiment, the titanium separator member that is prepared in step S10 is a member in which the average value of the atomic percent of carbon atoms in the range Rd0 of 50 nm deep from the surface (depth of 0) is no more than 5%. However, the atomic percent of carbon atoms of the titanium separator member that is prepared in step S10 may also be another value. For example, the average value of the atomic percent of carbon atoms within a predetermined range from the surface of the separator member may be made to be no more than 6%. However, the average value of the atomic percent of carbon atoms within a predetermined range from the surface is preferably 4% to 6%, more preferably 4.5% to 5.5%, and even more preferably 4.8% to 5.2%.

C4. Modified Example 4

In the foregoing example embodiment, a surface layer approximately 20 nm thick of the separator member is removed before the plating is applied. However, the thickness of the surface layer that is removed before the plating is applied may vary according to the distribution of the atomic percent of carbon atoms of the member. That is, a process may be performed in which a portion that has a higher carbon content than the surface portion of the bare metal portion after the removal process is removed as the surface layer before the plating is applied. In other words, the process of removing the surface layer may be one which removes a portion that includes the surface of the member such that the carbon content of the surface portion that is to be plated is reduced.

Incidentally, the term "surface portion" of the bare metal portion refers to a range up to 50 nm deep from the surface of the bare metal portion. Also, the carbon content of the surface portion of the bare metal portion is evaluated by the average value of the atomic percent of carbon atoms in the surface portion of the bare metal portion.

In the process for removing the surface layer, a polishing method other than buffing may also be used and other machining such as grinding may also be performed. Also, the surface layer may be removed by short blasting or laser.

Also in the foregoing example embodiment, the atomic percent of carbon atoms in the bare metal portion after the surface layer has been removed is less than 5% (see C2 in FIG. 2). However, the atomic percent of carbon atoms in the bare metal portion after the surface layer has been removed can be any one of a variety of values depending on the structure of the bare metal portion, the precious metal used for plating, and the plating method and the like. However, the atomic percent of carbon atoms in the surface portion of the bare metal portion after the surface layer has been removed is preferably no more than 30%, more preferably no more than 10%, and even more preferably no more than 5%.

C5. Modified Example 5

In the foregoing example embodiment, spattering is performed in step S30 directly after the buffing in step S20 in FIG. 1. However, argon spattering may also be performed to remove the oxide (such as $TiO_2$ when the bare metal portion is formed of titanium) formed on the surface of the metal member after the buffing and before the plating is applied. Accordingly, even if oxide forms on the surface of the metal member before the plating is applied, that oxide can be removed. As a result, the bond between the plating layer and the metal material can be made even stronger.

C6. Modified Example 6

In the foregoing example embodiment, when the gold plating is applied to the surface of the separator member, it is spattered on in a $10^{-2}$ Torr argon atmosphere. However, when applying precious metal plating to the surface of the metal member, various temperatures, pressures including atmospheric pressure, and apply times can be used. Also, the process can be performed in an atmosphere of another inert gas such as in a helium atmosphere. That is, the heat treatment can be performed in an inert atmosphere. Here, the term "inert atmosphere" refers to an atmosphere in which metal oxide will not be form on the bare metal portion even if the heat treatment is performed.

C7. Modified Example 7

In the foregoing example embodiment, when heat treating the separator member, the treatment is performed at a target temperature of 400° C. for 30 minutes in a $10^{-2}$ argon atmosphere. However, when heat treating the metal member, various temperatures, pressures, and heat treating times can be used. Also, the treatment can be performed in an atmosphere of another inert gas such as in a helium atmosphere. However, the heating temperature is preferably between 220° C. and 500° C., inclusive, more preferably between 350° C. and 450° C., inclusive, and even more preferably between 380° C. and 420° C., inclusive.

C8. Modified Example 8

In the foregoing example embodiment, the hydrogen content at the boundary surface of the plating layer and the bare metal portion is no more than 1%. However, the hydrogen content at the boundary surface of the plating layer and the bare metal portion may be another value depending on the structure of the bare metal portion, the precious metal used for plating, and the plating method and the like. However, the hydrogen content near the boundary surface of the plating layer and the bare metal portion is preferably no more than 1%, more preferably no more than 0.7%, and even more preferably no more than 0.5%.

C9. Modified Example 9

A fuel cell may also be manufactured using separators that were manufactured according to the method of the foregoing example embodiment. This fuel cell includes the separators and membrane electrode assemblies (MEA) that generate electricity through an electrochemical reaction with a reaction gas. Each MEA includes an electrolyte membrane and electrodes provided on both sides of the electrolyte membrane. The separators are then provided on the sides of the electrodes opposite the electrolyte membrane such that one MEA is separated from another by a separator, with the separators contacting the electrodes via the portions that have been gold plated.

With this kind of fuel cell, the separators are formed of a metal that forms a passive film on the surface. As a result, the separators will not corrode and are thus able to perform stably for an extended period of time. Also, the separators contact the electrodes via the portions that have been plated with a precious metal so the contact resistance between the separators and the electrodes is small. Accordingly, the power generating efficiency is higher than it is when the contact portions between the separators and the electrodes are not plated with a precious metal. Furthermore, with the portions that have been plated with the precious metal, oxide does not easily form at the boundary surface between the precious metal layer and the bare metal portion of the separator, and as a result, the precious metal plating does not easily peel away.

The invention claimed is:

1. A metal member comprising:
   a plating layer of a precious metal selected from a group consisting of gold, silver and platinum group metals, the plating layer being disposed on a surface of a separator portion including a predetermined metal,
   wherein an atomic percent of hydrogen atoms is no more than 1.0% in an area of the metal member near a boundary surface between the separator portion and the plating layer,
   wherein the area of the metal member near the boundary surface extends through a thickness of the metal member from approximately 10 nm away from the boundary surface into the plating layer to approximately 10 nm away from the boundary surface into the separator portion.

2. The metal member according to claim 1, wherein an atomic percent of carbon atoms in the area near the boundary surface is no more than 30%.

3. The metal member according to claim 2, wherein an average value of the atomic percent of carbon atoms in the area near the boundary surface is no more than 5.5%.

4. The metal member according to claim 2, wherein an average value of the atomic percent of carbon atoms in the area near the boundary surface is approximately 5%.

5. The metal member according to claim 1, wherein the predetermined metal is titanium or a titanium alloy.

6. The metal member according to claim 1, wherein the predetermined metal is stainless steel.

* * * * *